United States Patent
Aoki

(10) Patent No.: US 8,411,484 B2
(45) Date of Patent: Apr. 2, 2013

(54) SEMICONDUCTOR MEMORY DEVICE AND METHOD OF WRITING INTO THE SAME

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 782 days.

(21) Appl. No.: 12/262,577

(22) Filed: Oct. 31, 2008

(65) Prior Publication Data
US 2009/0059651 A1 Mar. 5, 2009

Related U.S. Application Data

(63) Continuation of application No. PCT/JP2006/309743, filed on May 16, 2006.

(51) Int. Cl.
*G11C 11/00* (2006.01)
*G11C 7/00* (2006.01)
*G11C 7/22* (2006.01)

(52) U.S. Cl. .................. 365/148; 365/163; 365/189.16; 365/158; 365/189.06

(58) Field of Classification Search .................. 365/148, 365/158, 163, 189.16, 189.06
See application file for complete search history.

(56) References Cited

U.S. PATENT DOCUMENTS

| | | | |
|---|---|---|---|
| 2004/0114444 A1 | 6/2004 | Matsuoka | |
| 2004/0264244 A1 | 12/2004 | Morimoto | |
| 2005/0122768 A1 | 6/2005 | Fukumoto | |
| 2005/0174854 A1 | 8/2005 | Tsushima et al. | |

FOREIGN PATENT DOCUMENTS

| | | |
|---|---|---|
| JP | 2004-234707 A | 8/2004 |
| JP | 2005-025914 A | 1/2005 |
| JP | 2005-092912 A | 4/2005 |
| JP | 2005-216387 A | 8/2005 |

OTHER PUBLICATIONS

I.G. Baek et al., Highly Scalable Non-volatile Resistive Memory Using Simple Binary Oxide Driven by Asymmetric Unipolar Voltage Pulses, IEDM, 2004, pp. 587-590.
International Search Report of PCT/JP2006/309743, Mailing Date of Aug. 15, 2006.
Japanese Office Action dated May 10, 2011, issued in corresponding Japanese Patent Application No. 2008-515411.

*Primary Examiner* — J. H. Hur
(74) *Attorney, Agent, or Firm* — Westerman, Hattori, Daniels & Adrian, LLP

(57) ABSTRACT

A method of writing into a semiconductor memory device, which includes a resistance memory element 14 which memorizes a high resistance state and a low resistance state and switches between the high resistance state and the low resistance state by an application of a voltage; a transistor 12 including a drain terminal connected to one terminal of the resistance memory element 14 and a source terminal connected to a reference voltage; and a transistor 16 including a source terminal connected to the other terminal of the resistance memory element 14. When a write voltage is applied to the resistance memory element 14 via the transistor 16 to switch the resistance memory element 14 from the low resistance state to the high resistance state, a voltage to be applied to the resistance memory element 14 is controlled at a value which is not less than a reset voltage of the resistance memory element 14 and less than a set voltage of the resistance memory element 14 by controlling a voltage to be applied to a gate terminal of the transistor 16 so as to be set at a value which is not less than a total of the reset voltage and a threshold voltage of the transistor 16 and is less than a total of the set voltage and the threshold voltage of the transistor 16.

10 Claims, 11 Drawing Sheets

SEMICONDUCTOR MEMORY DEVICE AND METHOD OF WRITING INTO THE SAME

CROSS REFERENCE TO RELATED APPLICATIONS

This application is a Continuation of International Application No. PCT/JP2006/309743, with an international filing date of May 16, 2006, which designating the United States of America, the entire contents of which are incorporated herein by reference.

FIELD

The present invention relates to a semiconductor memory device including a resistance memory element which memorizes a plurality of resistance states of different resistances, and method of writing into the same.

BACKGROUND

Recently, as a new memory device, a nonvolatile semiconductor memory device called ReRAM (Resistance Random Access Memory) is noted. The ReRAM uses a resistance memory element which has a plurality of resistance states of different resistance values, which are changed by electric stimulations applied from the outside and whose high resistance state and low resistance state are corresponded to, e.g., information "0" and "1" to be used as a memory element. The ReRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known and, depending on the electric characteristics, can be classified largely in two.

FIG. 9 illustrates the electric characteristics of the resistance memory element. As illustrated in FIG. 9, as a voltage are applied increasingly to the resistance memory element in the high resistance state, the resistance value abruptly decreases when the voltage exceeds a certain value (set voltage $V_{set}$), and the resistance memory element transits to the low resistance state. This operation is generally called "set". On the other hand, a voltage is gradually applied to the resistance memory element in the low resistance state, the resistance value abruptly increases when the voltage exceeds a certain value (reset voltage $V_{reset}$), and the resistance memory element transits to the high resistance state. This operation is generally called "reset".

These operations make it possible to control the resistance state of the resistance memory element by simply applying voltages to the resistance memory element. Data can be read by measuring the value of a current flowing in the element when a voltage which does not cause the reset is applied to the element.

The nonvolatile semiconductor memory device using the resistance memory element is disclosed in, e.g., Japanese Laid-Open Patent Publication No. 2005-025914, and I. G. Baek et al., Tech. Digest IEDM 2004, p. 587.

However, in the method of simply applying a voltage to the resistance memory element to thereby reset the resistance memory element from the low resistance state to the high resistance state, due to the resistance value increase accompanying the resistance state change from the high resistance state to the low resistance state, an excessive voltage which exceeds the reset voltage is applied to the resistance memory element immediately after reset. When this voltage is higher than the set voltage, the resistance memory element transits from the high resistance state again to the low resistance state, which makes it impossible to make normal write operation.

When the resistance memory element is set from the high resistance state to the low resistance state, excessive current flows in the resistance memory element due to the abrupt resistance value decrease due to the resistance state change from the high resistance state to the low resistance state. Accordingly, for the set operation, it is essential to limit the current so as to prevent the breakage of the select transistor, the resistance memory element, etc.

SUMMARY

According to one aspect of an embodiment, there is provided a method of writing into a semiconductor memory device having a resistance memory element which memorizes a high resistance state and a low resistance state and switches between the high resistance state and the low resistance state by an application of a voltage; a first transistor having a drain terminal connected to one terminal of the resistance memory element and a source terminal connected to a reference voltage; and a second transistor having a source terminal connected to the other terminal of the resistance memory element, including: controlling a channel resistance of the first transistor at a value which is sufficiently smaller than a resistance value of the resistance memory element in the high resistance state and is sufficiently larger than a resistance value of the resistance memory element in the low resistance state by controlling a first drive voltage to be applied to a gate terminal of the first transistor, when a write voltage is applied to the resistance memory element via the second transistor to switch the resistance memory element from the high resistance state to the low resistance state.

According to another aspect of an embodiment, there is provided a method of writing into a semiconductor memory device having a resistance memory element which memorizes a high resistance state and a low resistance state and switches between the high resistance state and the low resistance state by an application of a voltage; a first transistor having a drain terminal connected to one terminal of the resistance memory element and a source terminal connected to a reference voltage; and a second transistor having a source terminal connected to the other terminal of the resistance memory element, including: controlling a voltage to be applied to the resistance memory element at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when a write voltage is applied to the resistance memory element via the second transistor to switch the resistance memory element from the low resistance state to the high resistance state.

According to further another aspect of an embodiment, there is provided a semiconductor memory device including: a resistance memory element which memorizes a high resistance state and a low resistance state and switches between the high resistance state and the low resistance state by an application of a voltage; a first transistor having a drain terminal connected to one terminal of the resistance memory element and a source terminal connected to a reference voltage; a second transistor having a source terminal connected to the other terminal of the resistance memory element; and a control circuit which controls a channel resistance of the first transistor at a value which is sufficiently smaller than a resistance value of the resistance memory element in the high resistance state and is sufficiently larger than a resistance value of the resistance memory element in the low resistance state by controlling a first drive voltage to be applied to a gate terminal of the first transistor, when a write voltage is applied to the resistance memory element via the second transistor to switch the resistance memory element from the high resistance state to the low resistance state, and which controls a voltage to be applied to the resistance memory element at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when a write voltage, is applied to the resistance memory element via the second transistor to switch the resistance memory element from the low resistance state to the high resistance state.

According to further another aspect of an embodiment, there is provided a semiconductor memory device comprising: a resistance memory element which memorizes a high resistance state and a low resistance state and switches between the high resistance state and the low resistance state by an application of a voltage; a first transistor comprising a drain terminal connected to one terminal of the resistance memory element and a source terminal connected to a reference voltage; a second transistor comprising a source terminal connected to the other terminal of the resistance memory element; and a control circuit which controls a channel resistance of the first transistor at a value which is sufficiently smaller than a resistance value of the resistance memory element in the high resistance state and is sufficiently larger than a resistance value of the resistance memory element in the low resistance state by controlling a first drive voltage to be applied to a gate terminal of the first transistor, when a write voltage is applied to the resistance memory element via the second transistor to switch the resistance memory element from the high resistance state to the low resistance state.

According to further another aspect of an embodiment, there is provided a semiconductor memory device including: a resistance memory element which memorizes a high resistance state and a low resistance state and switches between the high resistance state and the low resistance state by an application of a voltage; a first transistor having a drain terminal connected to one terminal of the resistance memory element and a source terminal connected to a reference voltage; a second transistor having a source terminal connected to the other terminal of the resistance memory element; and a control circuit which controls a voltage to be applied to the resistance memory element at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when a write voltage is applied to the resistance memory element via the second transistor to switch the resistance memory element from the low resistance state to the high resistance state.

According to further another aspect of an embodiment, there is provided a semiconductor memory device including: a plurality of memory cells arranged in a matrix and each of which includes a resistance memory element which memorizes a high resistance state and a low resistance state and switches between the high resistance state and the low resistance state by an application of a voltage; a plurality of bit lines extended in a first direction and arranged in parallel with each other, each of the bit lines being connected to the other terminals of the resistance memory elements of the memory cells arranged in the first direction; a plurality of word lines extended in a second direction crossing the first direction and arranged in parallel with each other, each of the word line being connected to gate terminals of the first transistors of the memory cells arranged in the second direction; a plurality of second transistors, each of the second transistors being connected to each of the plurality of bit lines, each of the second transistors having a source terminal connected via the bit line to the other terminals of the resistance memory elements of the memory cells arranged in the first direction; and a control circuit which controls a channel resistance of the first transistor of an arbitrary one of the plurality of memory cells at a value which is sufficiently smaller than a resistance value of the resistance memory element in the high resistance state and is sufficiently larger than a resistance value of the resistance memory element in the low resistance state by controlling a first drive voltage to be applied to the word line associated with the arbitrary memory cell, when the resistance memory element of the arbitrary memory cell is switched from the high resistance state to the low resistance state, and which controls a voltage to be applied to the resistance memory element of an arbitrary one of the plurality of memory cells at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when the resistance memory element of the arbitrary memory cell is switched from the low resistance state to the high resistance state.

Additional objects and advantageous of the embodiment will be set forth in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

Figure 2:
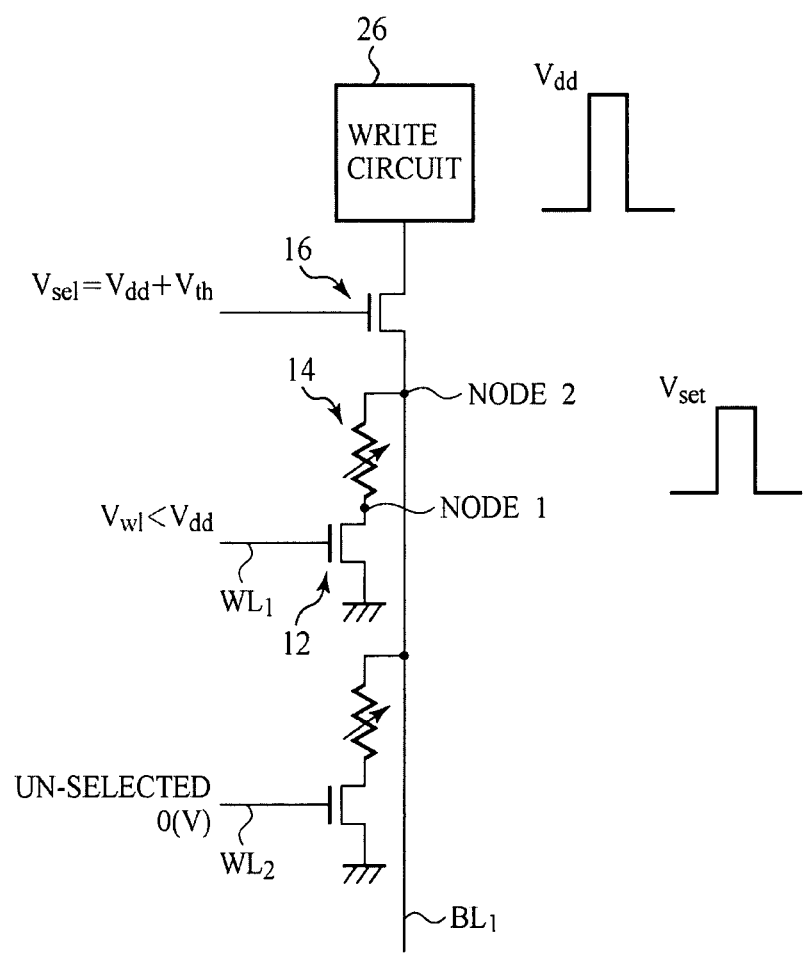
FIG. 2 is a circuit diagram illustrating the method of writing into the nonvolatile semiconductor memory device according to the first embodiment of the present invention (set operation)
Figure 3:
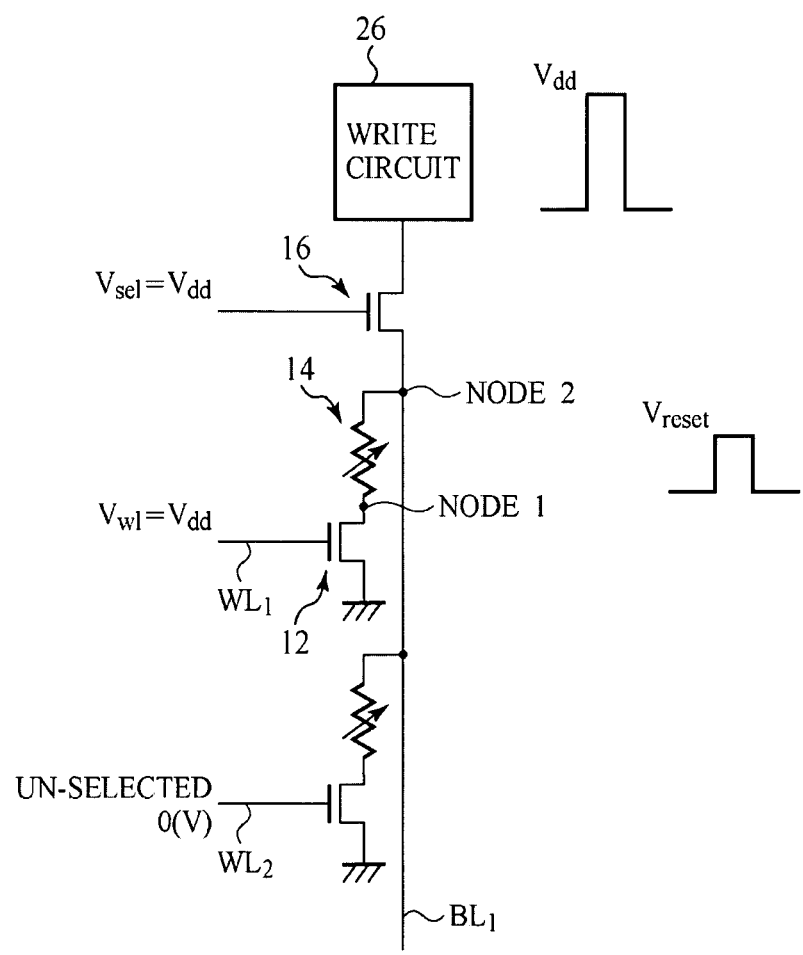
FIG. 3 is a circuit diagram illustrating the method of writing into the nonvolatile semiconductor memory device according to the first embodiment of the present invention (reset operation)

The nonvolatile semiconductor memory device and the method of writing into the same according to a first embodiment of the present invention will be explained with reference to FIGS. 1 to 3.

Figure 1:
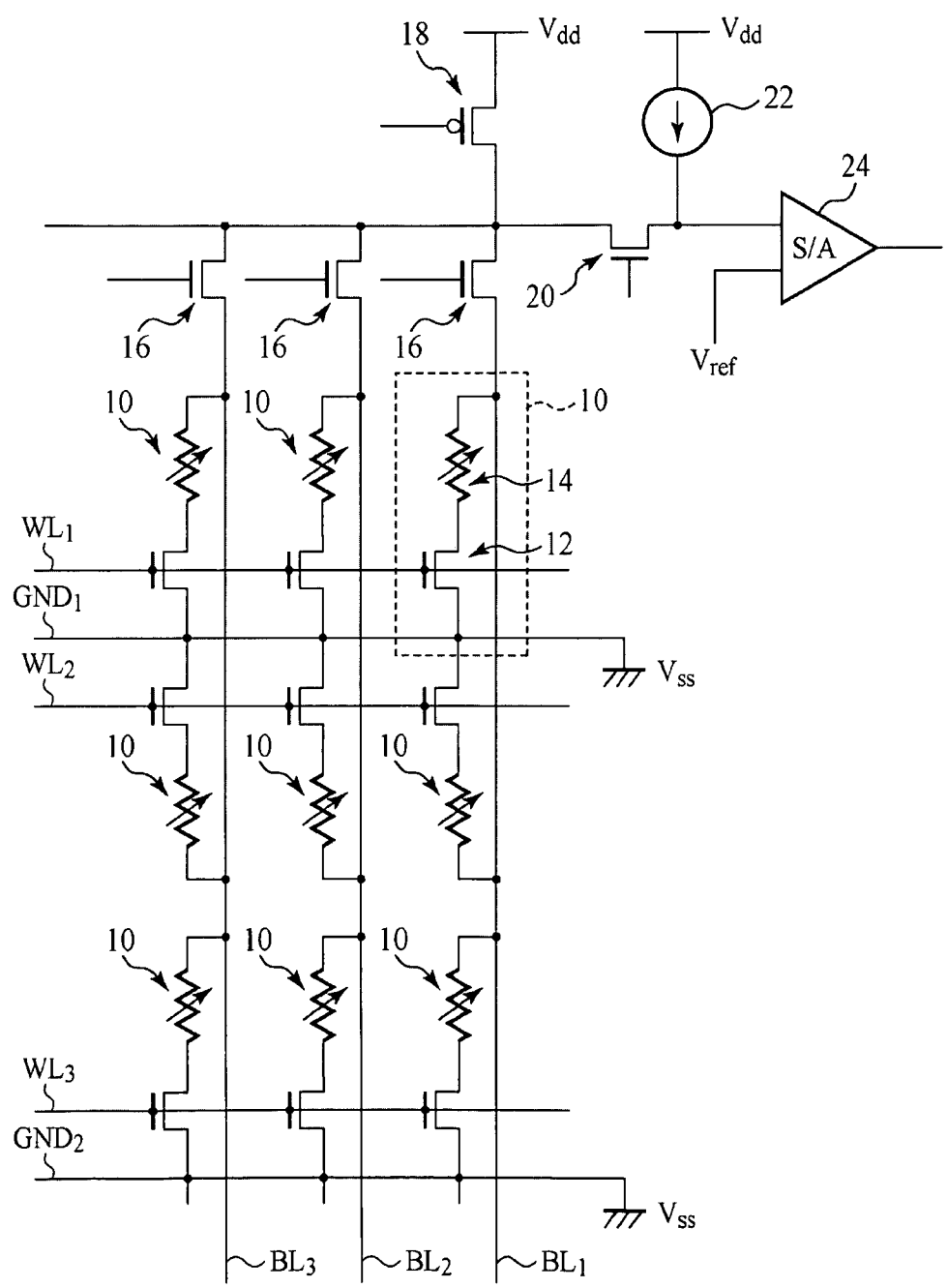
FIG. 1 is a circuit diagram illustrating the structure of the nonvolatile semiconductor memory device according to a first embodiment of the present invention.

FIG. 1 is a circuit diagram illustrating the structure of the nonvolatile semiconductor memory device according to the present embodiment. FIGS. 2 and 3 are circuit diagrams illustrating the method of writing into the nonvolatile semiconductor memory device according to the present embodiment.

First, the circuit structure of the nonvolatile semiconductor memory device according to the present embodiment will be explained with reference to FIG. 1.

The nonvolatile semiconductor memory device according to the present embodiment includes memory cells 10 each including one select transistor (the first transistor) 12 and one resistance memory element 14, which are arranged in a matrix row-wise (horizontally in the drawing) and column-wise (vertically in the drawing). In each memory cell 10, the drain terminal of the select transistor 12 is connected to one terminal of the resistance memory element 14.

A word line WL commonly connecting the gate terminals of the select transistors 12 included in the memory cells 10 arranged row-wise, and a ground line GND commonly connecting the source terminals of the select transistors 12 included in the memory cells 10 arranged row-wise are provided in each row of the memory cells 10. The ground line GND is connected to a ground potential ($V_{ss}$). In FIG. 1, a plurality of the word lines WL and the ground lines GND are represented by $WL_1$, $WL_2$, $WL_3$, . . . , and $GND_1$, $GND_2$, . . . .

A bit line BL commonly connecting the terminals of the resistance memory elements 14, which are opposite to the terminals thereof connected to the select transistors 12 is provided in each column of the memory cells 10. In FIG. 1, a plurality of bit lines are represented by $BL_1$, $BL_2$, $BL_3$, . . . .

A column selector (the second transistor) 16 of an n-channel transistor is provided at one end of each bit line BL. The source terminals of the column selectors 16 are connected to the bit lines BL. The drain terminals of the column selectors 16 are commonly connected and are connected to a power supply line ($V_{dd}$) via a p-channel transistor 18. The drain terminals of the column selectors 16 are also connected to a current source 22 and a sense amplifier 24 via an n-channel transistor 20.

Next, the method of writing into the nonvolatile semiconductor memory device according to the present embodiment will be explained with reference to FIGS. 2 and 3.

First, the write operation from the high resistance state to the low resistance state, i.e., the set operation will be explained with reference to FIG. 2. The writing is made here in the upper right memory cell 10 connected to the word line $WL_1$ and the bit line $BL_1$ in FIG. 1.

First, a prescribed drive voltage $V_{wl}$ is applied to the word line $WL_1$ to turn on the select transistor 12. At this time, the drive voltage $V_{wl}$ to be applied to the word line $WL_1$ is so set that the channel resistance $R_{tr}$ of the select transistor 12 is sufficiently smaller than a resistance value $R_{high}$ of the resistance memory element 14 in the high resistance state and is sufficiently larger than a resistance value $R_{low}$ of the resistance memory element 14 in the low resistance state. The drive voltage $V_{wl}$ can be set at, e.g., $V_{wl} < V_{dd}$ when the power supply voltage is $V_{dd}$.

To the un-selected word lines $WL_2$, $WL_3$, . . . , 0 V, for example, is applied to turn off the select transistors 12.

Then, a prescribed drive voltage $V_{sel}$ is applied to the gate terminal of the column selector 16 to turn on the column selector 16. To the gate terminal of the column selector 16, a drive voltage $V_{sel}$ which is above a total voltage of a set voltage $V_{set}$ of the resistance memory element 14 and a threshold voltage $V_{th}$ of the column selector 16 ($V_{set}+V_{th}$) is applied. Thus, the write circuit 26 and the bit line $BL_1$ are connected to each other, and the bit line $BL_1$ is selected. The write circuit 26 is a drive circuit for applying a write voltage, which includes the p-channel transistor 18 illustrated in FIG. 1.

The drive voltage $V_{sel}$ can be set at, e.g., a voltage which is the power supply voltage $V_{dd}$ increased by the threshold voltage $V_{th}$ of the column selector 16 ($V_{dd}+V_{th}$). Taking into consideration the nonvolatile semiconductor memory device of the generation whose power supply voltage $V_{dd}$ is low (e.g., $V_{dd} \leq 1.8$ V), the drive voltage $V_{sel}$ to be applied to the gate terminal of the column selector 16 is set at $V_{dd}+V_{th}$. That is, in the circuit illustrated in FIG. 2, when the drive voltage $V_{sel}$ to be applied to the gate terminal of the column selector 16 is set at $V_{dd}$, the voltage $V_{bl}$ of the bit line $BL_1$ becomes $V_{dd}-V_{th}$, so that the case that the voltage not less than the set voltage $V_{set}$ cannot be applied to the resistance memory element 14 is assumed. When the voltage not less than the set voltage $V_{set}$ can be applied without pumping the drive voltage $V_{sel}$ to be applied to the gate terminal of the column selector 16 (for example, the case that the power supply voltage $V_{dd}$ is 5 V, and the circuit is formed by the 5 V transistors), it is not necessary to apply the pumping voltage to the gate terminal of the column selector 16.

Next, the write circuit 26 outputs a write pulse voltage which is above the set voltage $V_{set}$ of the resistance memory element 14. At this time, the drive voltage $V_{sel}$ of not less than a total voltage of the set voltage $V_{set}$ of the resistance memory element 14 and the threshold voltage $V_{th}$ of the column selector 16 ($V_{set}+V_{th}$) is applied to the gate terminal of the column selector 16, so that the voltage $V_{bl}$ of the bit line $BL_1$ is clamped on $V_{sel}-V_{th}$.

The write pulse voltage outputted from the write circuit 26 can be set at, e.g., the power supply voltage $V_{dd}$. In this case, in the above-described example, where the drive voltage $V_{sel}$ is set at $V_{dd}+V_{th}$, the voltage $V_{bl}$ of the bit line $BL_1$ is clamped on the poser supply voltage $V_{dd}$.

Thus, to the resistance memory element 14 and the select transistor 12, the voltage $V_{b1}$ of the bit line $BL_1$ is divided into a ratio of the resistance value of the resistance memory element 14 and the channel resistance $R_{tr}$ of the select transistor 12 to be applied.

At this time, because of the channel resistance $R_{tr}$ of the select transistor 12 which is controlled to be sufficiently smaller than the resistance value $R_{high}$ of the resistance memory element 14 in the high resistance state, most of the voltage $V_{b1}$ of the bit line $BL_1$ is applied to the resistance memory element 14 in the high resistance state. Because of the voltage $V_{b1}$ of the bit line $BL_1$ which is set at a value of not less than the set voltage $V_{set}$ of the resistance memory element 14, the resistance memory element 14 is set in the high resistance state from the low resistance state.

The channel resistance $R_{tr}$ of the select transistor 12 in the set operation is controlled a little high, whereby immediately after the resistance memory element 14 is set in the low resistance state from the high resistance state, most of the voltage $V_{bl}$ of the bit line $BL_1$ is applied to the select transistor 12, and the current flowing in the resistance memory element 14 and the select transistor 12 is limited by the resistance of the select transistor 12. That is, the select transistor 12 can be used as a current limit element.

Then, the column selector 16 and the select transistor 14 are sequentially turned off, and the set operation is completed.

To certify the above-described write method, an SPICE simulation was made on the nonvolatile semiconductor memory device using 0.18 µm-technology. In this simulation, the resistance value $R_{high}$ of the resistance memory element 14 in the high resistance state was set at 80 kΩ; the resistance value $R_{low}$ thereof in the low resistance state, 4 kΩ; the set voltage $V_{set}$, 1.5 V; the reset voltage $V_{reset}$, 0.5 V; and the power supply voltage $V_{dd}$, 1.8 V. To the gate terminal of the column selector 16, 2.5 V which is the power supply voltage $V_{dd}$ increased by the threshold voltage $V_{th}$ was applied, and to the gate terminal of the select transistor 12, 1.0 V which is lower than the power supply voltage $V_{dd}$ was applied. The gate width of the column selector 16 was 3 µm, and the gate width of the select transistor 12 was 0.36 µm.

As the result, it has been found that before set, the voltage of the node 2 is 1.64 V, the voltage of the node 1 is 0.08 V, 1.56 V which is higher than the set voltage is applied to the resistance memory element 14, and the normal set operation is made.

It has been found that in the state after set, the voltage of the node 2 is 1.56 V, the voltage of the node 1 is 1.31 V, 0.25 V which is lower than the reset voltage is applied to the resistance memory element 14, and the set state can be retained.

It has been found that the channel resistance at the time when 1.0 V is applied to the gate terminal of the select transistor 12 is about 21 kΩ, and the current flowing in the resistance memory element 14 and the select transistor 12 after set can be limited to 62.5 µA.

Next, the write operation from the low resistance state to the high resistance state, i.e., the reset operation will be explained with reference to FIG. 3. The write is made here in the upper right memory cell 10 connected to the word line $WL_1$ and the bit line $BL_1$ in FIG. 1.

First, a prescribed drive voltage $V_{wl}$ is applied to the word line $WL_1$ to turn on the select transistor 12. At this time, the drive voltage $V_{wl}$ to be applied to the word line $WL_1$ is so set that the channel resistance $R_{tr}$ of the select transistor 12 is sufficiently smaller than a resistance value $R_{low}$ of the resistance memory element 14 in the low resistance state. The drive voltage $V_{wl}$ can be set at, e.g., the power supply voltage $V_{dd}$.

To the un-selected word lines $WL_2$, $WL_3$, . . . , 0 V, for example, is applied to turn off the select transistors 12.

Then, to the gate terminal of the column selector 16, a prescribed drive voltage $V_{sel}$ is applied to turn on the column selector 16. To the gate terminal of the column selector 16, the drive voltage $V_{sel}$ which is not less than the total voltage of the reset voltage $V_{reset}$ of the resistance memory element 14 and the threshold voltage $V_{th}$ of the column selector 16 ($V_{reset}+V_{th}$) and less than the total voltage of the set voltage $V_{set}$ of the resistance memory element 14 and the threshold voltage $V_{th}$ of the column selector 16 ($V_{set}+V_{th}$) (that is, $V_{set}+V_{th}>V_{sel}\geq V_{reset}+V_{th}$) is applied. Thus, the write circuit 26 and the bit line $BL_1$ are connected to each other, and the bit line $BL_1$ is selected.

The drive voltage $V_{sel}$ can be set at, e.g., the power supply voltage $V_{dd}$.

Then, the write circuit 26 outputs a write pulse voltage of not less than the total voltage of the reset voltage $V_{reset}$ of the resistance memory element 14 and the threshold voltage $V_{th}$ of the column selector 16 ($V_{reset}+V_{th}$). At this time, because of the drive voltage $V_{sel}$ applied to the gate terminal of the column selector 16, which is not less than the total voltage of the reset voltage $V_{reset}$ of the resistance memory element 14 and the threshold voltage $V_{th}$ of the column selector 18 ($V_{reset}+V_{th}$) and less than the total voltage of the set voltage $V_{set}$ of the resistance memory element 14 and the threshold voltage $V_{th}$ of the column selector 16 ($V_{set}+V_{th}$), the voltage $V_{bl}$ of the bit line $BL_1$ is clamped on $V_{set}-V_{th}$ ($V_{set}>V_{bl}\geq V_{reset}$).

The write pulse voltage can be set at, e.g., the power supply voltage $V_{dd}$. In such case, in the above-described example, in which the drive voltage $V_{sel}$ is set at the power supply voltage $V_{dd}$, the voltage $V_{bl}$ of the bit line $BL_1$ is clamped on $V_{dd}-V_{th}$.

Thus, to the resistance memory element 14 and the select transistor 12, the voltage $V_{bl}$ ($V_{set}>V_{bl}\geq V_{reset}$) is divided into a ratio of the resistance value of the resistance memory element 14 and the channel resistance $R_{tr}$ of the select transistor 12 to be applied.

At this time, because of the channel resistance $R_{tr}$ of the select transistor 12 controlled to be sufficiently smaller than the resistance value $R_{low}$, of the resistance memory element 14 in the low resistance state, most of the voltage $V_{bl}$ of the bit line $BL_1$ is applied to the resistance memory element 14 in the low resistance state. Because of the voltage $V_{bl}$ of the bit line $BL_1$ set at a value which is not less than the reset voltage $V_{reset}$ of the resistance memory element 14, the resistance memory element 14 is reset from the low resistance state into the high resistance state.

There is a risk that immediately after the resistance memory element 14 has been reset in the high resistance state, the voltage to be applied to the resistance memory element 14 would increase. However, because of the voltage $V_{bl}$ of the bit line $B_1$ clamped on $V_{sel}-V_{th}$ ($V_{set}>V_{bl}\geq V_{reset}$), the voltage to be applied to the resistance memory element 14 never exceeds the set voltage $V_{set}$, and the resistance memory element 14 is never set again.

In the above-described example, in which the drive voltage $V_{sel}$ and the write pulse voltage are set at the power supply voltage $V_{dd}$, the voltage $V_{bl}$ of the bit line $BL_1$ is clamped on $V_{dd}-V_{th}$, but because this voltage becomes normally lower than the set voltage $V_{set}$ of the resistance memory element 14, problems of the recurrence of the set, etc. do not take place. When the voltage $V_{bl}$ (=$V_{dd}-V_{th}$) of the bit line $BL_1$ becomes higher than the set voltage $V_{set}$ of the resistance memory element 14, the drive voltage $V_{wl}$ to be applied to the word line $WL_1$ can be set low to increase the channel resistance of the select transistor 12, as in the set operation. Thus, the voltage to be divided into the select transistor 12 is increased, and the voltage to be applied to the resistance memory element 14 can be controlled to be not more than the set voltage $V_{set}$. At this time, the drive voltage $V_{wl}$ to be applied to the word line $WL_1$ is suitably controlled to make the voltage to be applied to the resistance memory element 14 to be not less than $V_{reset}$ and less than $V_{set}$.

Then, the column selector 16 and the select transistor 12 are sequentially turned off, and the reset operation is completed.

To certify the above-described write method, a SPICE simulation was made on the nonvolatile semiconductor memory device using 0.18 µm technology. In this simulation, the resistance value $R_{high}$ of the resistance memory element 14 in the high resistance state was 80 kΩ; the resistance value $R_{low}$ of the resistance memory element 14 in the low resistance state, 4 kΩ; the set voltage $V_{set}$, 1.5 V; the reset voltage $V_{reset}$, 0.5 V; and the power supply voltage $V_{dd}$, 1.8 V. The gate width of the column selector 16 was 3 µm, and the gate width of the select transistor 12 was 0.36 µm.

As the result, it has been found that in the state before reset, the voltage of the node 2 was 0.99 V, and the voltage of the node 1 was 0.43 V, 0.56 V, which is higher than the reset voltage was applied to the resistance memory element 14, and the reset operation is normally made.

It has been found that in the state after reset, the voltage of the node 2 is 1.08 V, the voltage of the node 1 was 0.03 V, and 1.05 V, which is lower than the set voltage is applied to the resistance memory element 14, and the reset state can be retained.

Next, the read method of the nonvolatile semiconductor memory device according to the present embodiment will be explained with reference to FIG. 1. Information memorized in the upper right memory cell 10 connected to the word line $WL_1$ and the bit line $BL_1$ in FIG. 1 is read.

First, the n-channel transistor 20 and the column selector 16 connected to the bit line $BL_1$ are turned on to precharge the bit line $BL_1$.

Next, a prescribed drive voltage $V_{wl}$ (e.g., $V_{dd}$) is applied to the word line $WL_1$ to turn on the select transistor 12.

Thus, the read current supplied from the current source 22 flows to the ground line $GND_1$ via the n-channel transistor 20, the column selector 16, the resistance memory element 14 and the select transistor 12. Accompanying this, a voltage $V_{read}$ corresponding to the resistance state of the resistance memory element 14 is outputted to the bit line $BL_1$.

Next, the sense amplifier 24 compares the voltage $V_{read}$ of the bit line $BL_1$ with the reference voltage $V_{ref}$ and based on their largeness relationship, judges whether the resistance memory element 14 is in the low resistance state or in the high resistance state.

Thus, memory information memorized in the memory cell 10 can be read.

The above-described mode for preventing the recurrence of the write in the reset operation by causing the column selectors 16 to make the source follower operation to clamp the potential of the bit lines BL on a prescribed value is good in compatibility with the read operation and facilitates the read.

Other memories using the resistance change are PRAM (Phase Shift Random Access Memory), MRAM (Magnetoresistive Random Access Memory), etc. The memory cell of these memories is generally a 1T-1R cell including a select transistor (Tr) and a memory element (R) and includes the select transistor on the ground side and the memory element on the bit line BL side. This circuit is the so-called common source circuit, and the select transistor acts as the constant current source, which facilitates the current read.

If the select transistor and the memory element are temporarily oppositely connected to each other, the flow of the read current increases the source potential of the select transistor and decreases the voltage between the gate terminal and the source terminal ($V_{gs}$), and the element resistance becomes very large, which makes it difficult to read resistance changes of the memory element. Accordingly, it is not preferable to use, in the write operation, the select transistor as the clamp transistor for clamping the voltage of the bit line BL.

To use the column selector 16 as the transistor for clamping the voltage of the bit line BL in the write operation is effective to retain the integration of the nonvolatile semiconductor memory device. To clamp the voltage of the bit line BL, it is preferable to make the gate width of the clamp transistor large to some extent. In the set operation, the gate voltage of the column selector 16 is increased by the threshold voltage $V_{th}$ so that the set voltage $V_{set}$ is applied to the resistance memory element 14 via the route of the write circuit 26—the column selector 16—bit line BL—the select transistor 12—the resistance memory element 14, and to lower the ON resistance as well, it is preferable to make the gate width of the column selector 16 large to some extent. The column selector 16, which is disposed for each bit line BL, has allowance for the layout and can have the width easily increased without much influencing the integration of the nonvolatile semiconductor memory device.

In the read method of the nonvolatile semiconductor memory device according to the present embodiment, the current source 22 is provided as the read circuit, and a bit line for the read current supplied from the current source 22 to flow to is selected by the column selector 16. Accordingly, the column selector 16 can be used as the clamp transistor for clamping the voltage of the bit line BL in the write operation. As the clamp transistor for clamping the voltage of the bit line BL in the write operation, the column selector 16 is not essential. Transistors for clamping the voltage of the bit lines BL in the write operation may be provided respectively for the respective bit lines BL.

As described above, according to the present embodiment, the nonvolatile semiconductor memory device includes a resistance memory element, the select transistors having the drain terminal connected to one terminal of the resistance memory element and the source terminal connected to the reference voltage, and clamp transistor having the source terminal connected to the other terminal of the resistance memory element, and when the write voltage is applied to a resistance memory element via the clamp transistor to switch the resistance memory element from the high resistance state to the low resistance state, the drive voltage to be applied to the gate terminal of the select transistor is so controlled that the channel resistance of the select transistor is sufficiently smaller than the resistance value of the resistance memory element in the high resistance state and sufficiently larger than the resistance value of the resistance memory element in the low resistance state, whereby most of the write voltage can be applied to the select transistor immediately after the resistance memory element has been switched to the low resistance state. Thus, the current to flow to the elements can be limited.

When the write voltage is applied to the resistance memory element via the clamp transistor to switch the resistance memory element from the low resistance state to the high resistance state, the voltage to be applied to the gate terminal of the clamp transistor is set at a value which is not less than the total of the reset voltage of the resistance memory element and the threshold voltage of the clamp transistor and less than the total of the set voltage of the resistance memory element and the threshold voltage to thereby control the voltage to be applied to the resistance memory element to be a value which is not less than the reset voltage and less than the set voltage, whereby the voltage to be applied to the resistance memory element immediately after the resistance memory element has been switched to the high resistance state can be suppressed to be less than the set voltage. Thus, the resistance memory element can be prevented from being set again.

As the clamp transistor, the column selector which selects the bit line can be used. Accordingly, the above-described effects can be produced without changing the basic structure of the memory cell and lowering the integration of the memory cells.

The method of writing into the nonvolatile semiconductor memory device according to a second embodiment of the present invention will be explained with reference to FIGS. 4 and 5. The same members of the present embodiment as those of the nonvolatile semiconductor memory device according to the first embodiment illustrated in FIG. 1 are represented by the same reference numbers not to repeat or to simplify their explanation.

Figure 4:
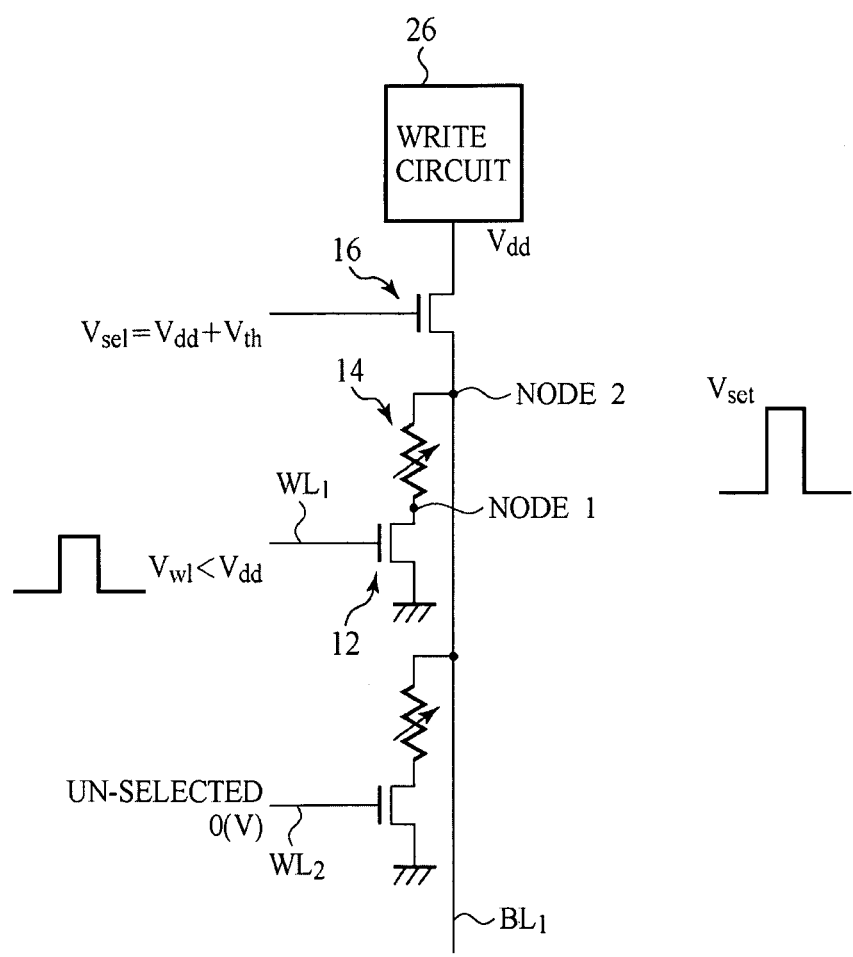
FIG. 4 is a circuit diagram illustrating the method of writing into the nonvolatile semiconductor memory device according to a second embodiment of the present invention (set operation)
Figure 5:
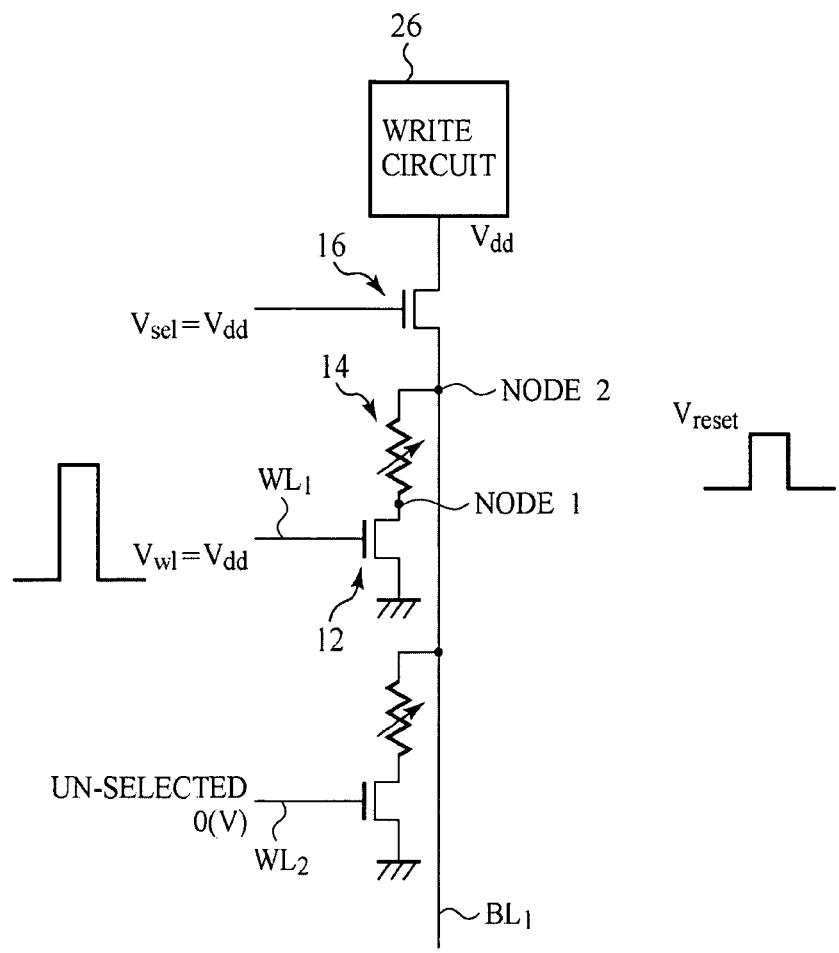
FIG. 5 is a circuit diagram illustrating the method of writing into the nonvolatile semiconductor memory device according to the second embodiment of the present invention (reset operation)

FIGS. 4 and 5 are circuit diagrams illustrating the method of writing into the nonvolatile semiconductor memory device according to the present embodiment.

In the present embodiment, another method of writing into the nonvolatile semiconductor memory device according to the first embodiment illustrated in FIG. 1 will be described. The method of writing into the nonvolatile semiconductor memory device according to the present embodiment is basically the same as that according to the first embodiment. The method of writing into the nonvolatile semiconductor memory device according to the present embodiment is different from that according to the first embodiment in that in the former, the write voltage is a constant voltage, and the drive voltage to be applied to the gate terminal of the select transistor is a pulse voltage.

First, the write operation from the high resistance state to the low resistance state, i.e., the set operation will be explained with reference to FIG. 4. The write is made here in the upper right memory cell 10 connected to the word line $WL_1$ and the bit line $BL_1$ in FIG. 1.

First, the write voltage is applied from the write circuit 26. The write voltage is a voltage which is not less than the set voltage $V_{set}$ of the resistance memory element 14. The write voltage may be set at, e.g., the power supply voltage $V_{dd}$.

Then, a prescribed drive voltage $V_{sel}$ is applied to the gate terminal of the column selector 16 to turn on the column selector 16. To the gate terminal of the column selector 16, the drive voltage $V_{sel}$ of not less than the total voltage of the set voltage $V_{set}$ of the resistance memory element 14 and the threshold voltage $V_{th}$ of the column selector 16 ($V_{set}+V_{th}$) is applied. Thus, the write circuit 26 and the bit line $BL_1$ are connected to each other, and the voltage $V_{bl}$ of the bit line $BL_1$ is clamped on $V_{sel}-V_{th}$.

The drive voltage $V_{sel}$ can be set at, e.g., the voltage which is the power supply voltage $V_{dd}$ increased by the threshold voltage $V_{th}$ of the column selector 16 ($V_{dd}+V_{th}$). In this case, the voltage $V_{bl}$ of the bit line $BL_1$ is clamped on the power supply voltage $V_{dd}$. When a voltage which is not less than the set voltage $V_{set}$ can be applied to the resistance memory element 14 without pumping the power supply voltage $V_{dd}$, it is not necessary to apply an increased voltage to the gate terminal of the column selector 16, as is not in the first embodiment.

Then, a prescribed drive voltage $V_{wl}$ (pulse voltage) is applied to the word line $WL_1$ to turn on the select transistor 12. At this time, the drive voltage $V_{wl}$ to be applied to the word line $WL_1$ is so set that the channel resistance $R_{tr}$ of the select transistor 12 is sufficiently smaller than the resistance value $R_{high}$ of the resistance memory element 14 in the high resistance state and is sufficiently larger than the resistance value $R_{low}$ of the resistance memory element 14 in the low resistance state. The drive voltage $V_{wl}$ can be set at, e.g., $V_{wl}<V_{dd}$ with the power supply voltage being $V_{dd}$.

0 V is applied to the un-selected word lines $WL_2$, $WL_3$, ... to turn off the select transistors 12.

Thus, to the resistance memory element 14 and the select transistor 12, the voltage $V_{bl}$ of the bit line $BL_1$ is divided into a ratio corresponding to the resistance value of the resistance memory element 14 and the channel resistance $R_{tr}$ of the select transistors 12 and applied.

At this time, because of the channel resistance $R_{tr}$ of the select transistor 12, which is controlled to be sufficiently smaller than the resistance value $R_{high}$ of the resistance memory element 14 in the high resistance state, most of the voltage $V_{bl}$ of the bit line $BL_1$ is applied to the resistance memory element 14 in the high resistance state. Because of the voltage $V_{bl}$ of the bit line $BL_1$ set at a value which is not less than the set voltage $V_{set}$ of the resistance memory element 14, the resistance memory element 14 is set in the low resistance state from the high resistance state.

The channel resistance $R_{tr}$ of the select transistor 12 in the set operation is controlled to be a little high whereby immediately after the resistance memory element 14 has been set in the low resistance state from the high resistance state, most of the voltage of $V_{bl}$ of the bit line $BL_1$ is applied to the select transistor 12, and the current to flow to the resistance memory element 14 and the select transistor 12 is limited by the resistance of the select transistor 12. That is, the select transistor 12 can be used as the current limit element.

Then, the column selector 16 is returned to the off-state, the application of the write voltage from the write circuit 26 is stopped, and the set operation is completed.

Next, the write operation from the low resistance state to the high resistance state, i.e., the reset operation will be explained with reference to FIG. 5. The write operation is made here in the upper right memory cell 10 connected to the word line $WL_1$ and the bit line $BL_1$ in FIG. 1.

First, the write voltage is applied from the write circuit 26. The write voltage is a voltage which is not less than the reset voltage $V_{reset}$ of the resistance memory element 14. The write voltage can be set at, e.g., the power supply voltage $V_{dd}$.

Then, a prescribed drive voltage $V_{sel}$ is applied to the gate terminal of the column selector 16 to turn on the column selector 16. To the gate terminal of the column selector 16, a drive voltage $V_{sel}$ which is not less than the total voltage of the reset voltage $V_{reset}$ of the resistance memory element 14 and the threshold voltage $V_{th}$ of the column selector 16 ($V_{reset}+V_{th}$) and is less than the total voltage of the set voltage $V_{set}$ of the resistance memory element 14 and the threshold voltage $V_{th}$ of the column selector 16 ($V_{set}+V_{th}$) (that is, $V_{set}+V_{th}>V_{sel}\geq V_{reset}+V_{th}$) is applied. Thus, the write circuit 26 and the bit line $BL_1$ are connected to each other, and the voltage $V_{bl}$ of the bit line $BL_1$ is clamped on $V_{sel}-V_{th}$ ($V_{set}>V_{bl}\geq V_{reset}$).

The drive voltage $V_{sel}$ can be set at, e.g., the power supply voltage $V_{dd}$. In this case, the voltage $V_{bl}$ of the bit line $BL_1$ is clamped on $V_{dd}-V_{th}$.

Next, a prescribed drive voltage $V_{wl}$ (pulse voltage) is applied to the word line $WL_1$ to turn on the select transistor 12. The drive voltage $V_{wl}$ to be applied to the word line $WL_1$ is so set that the channel resistance $R_{tr}$ of the select transistor 12 is sufficiently smaller than the resistance value $R_{low}$ of the resistance memory element 14 in the low resistance state. The drive voltage $V_{wl}$ can be set at, e.g., the power supply voltage $V_{dd}$.

0 V is applied to the un-selected word lines $WL_2$, $WL_3$, . . . to turn off the select transistors 12.

Thus, to the resistance memory element 14 and the select transistor 12, the voltage $V_{bl}$ of the bit line $BL_1$ ($V_{set} > V_{bl} \geq V_{reset}$) is divided into a ratio of the resistance value of the resistance memory element 14 and the channel resistance $R_{tr}$ of the select transistor 12 to be applied.

At this time, because of the channel resistance $R_{tr}$ of the select transistor 12, which is controlled to be sufficiently smaller than the resistance value $R_{low}$ of the resistance memory element 14 in the low resistance state, most of the voltage $V_{bl}$ of the bit line $BL_1$ is applied to the resistance memory element 14 in the low resistance state. Because of the voltage $V_{bl}$ of the bit line $BL_1$, which is set at a value of not less than the reset voltage $V_{reset}$ of the resistance memory element 14, the resistance memory element 14 is reset in the high resistance state from the low resistance state.

There is a risk that immediately after the resistance memory element 14 has been reset in the high resistance state, the voltage to be applied to the resistance memory element 14 might be increased. Because of the voltage $V_{bl}$ of the bit line $BL_1$ clamped on $V_{set} - V_{th}$ ($V_{set} > V_{bl} \geq V_{reset}$), the voltage to be applied to the resistance memory element 14 never exceeds the set voltage $V_{set}$, and the resistance memory element 14 is never set again.

Then, the column selector 16 is returned to the off-state, the application of the write voltage from the write circuit 26 is stopped, and the reset operation is completed.

As described above, according to the present embodiment, the nonvolatile semiconductor memory device includes the resistance memory element, the select transistor having the drain terminal connected to one end of the resistance memory element and the source terminal connected to the reference voltage, and the clamp transistor having the source terminal connected to the other terminal of the resistance memory element, and when the write voltage is applied to a resistance memory element via the clamp transistor to switch the resistance memory element from the high resistance state to the low resistance state, the drive voltage to be applied to the gate terminal of the select transistor is so controlled that the channel resistance of the select transistor is sufficiently smaller than the resistance value of the resistance memory element in the high resistance state and sufficiently larger than the resistance value of the resistance memory element in the low resistance state, whereby immediately after the resistance memory element has been switched to the low resistance state, most of the write voltage can be applied to the select transistor. Thus, the current to flow in the elements can be limited.

When the write voltage is applied to a resistance memory element via the clamp transistor to switch the resistance memory element from the low resistance state to the high resistance state, the voltage to be applied to the resistance memory element is controlled to be a value which is not less than the reset voltage and less than the set voltage by setting the voltage to be applied to the gate terminal of the clamp transistor at a value which is not less than the total of the reset voltage of the resistance memory element and the threshold voltage of the clamp transistor and less than the total of the set voltage of the resistance memory element and said threshold voltage, whereby immediately after the resistance memory element has been switched to the high resistance state, the voltage to be applied to the resistance memory element can be suppressed to be less than the set voltage. Thus, the resistance memory element is prevented from being set again.

As the above-described clamp transistor, the column selector, which selects a bit line can be used. This can produce the above-described effect without changing the basic structure of the memory cell and lowering the integration of the memory cells.

The nonvolatile semiconductor memory device and the method of manufacturing the same according to a third embodiment of the present invention will be explained with reference to FIGS. 6 to 8G. The same members of the present embodiment as those of the nonvolatile semiconductor memory device according to the first embodiment illustrated in FIG. 1 are represented by the same reference numbers not to repeat or to simplify their explanation.

Figure 6:
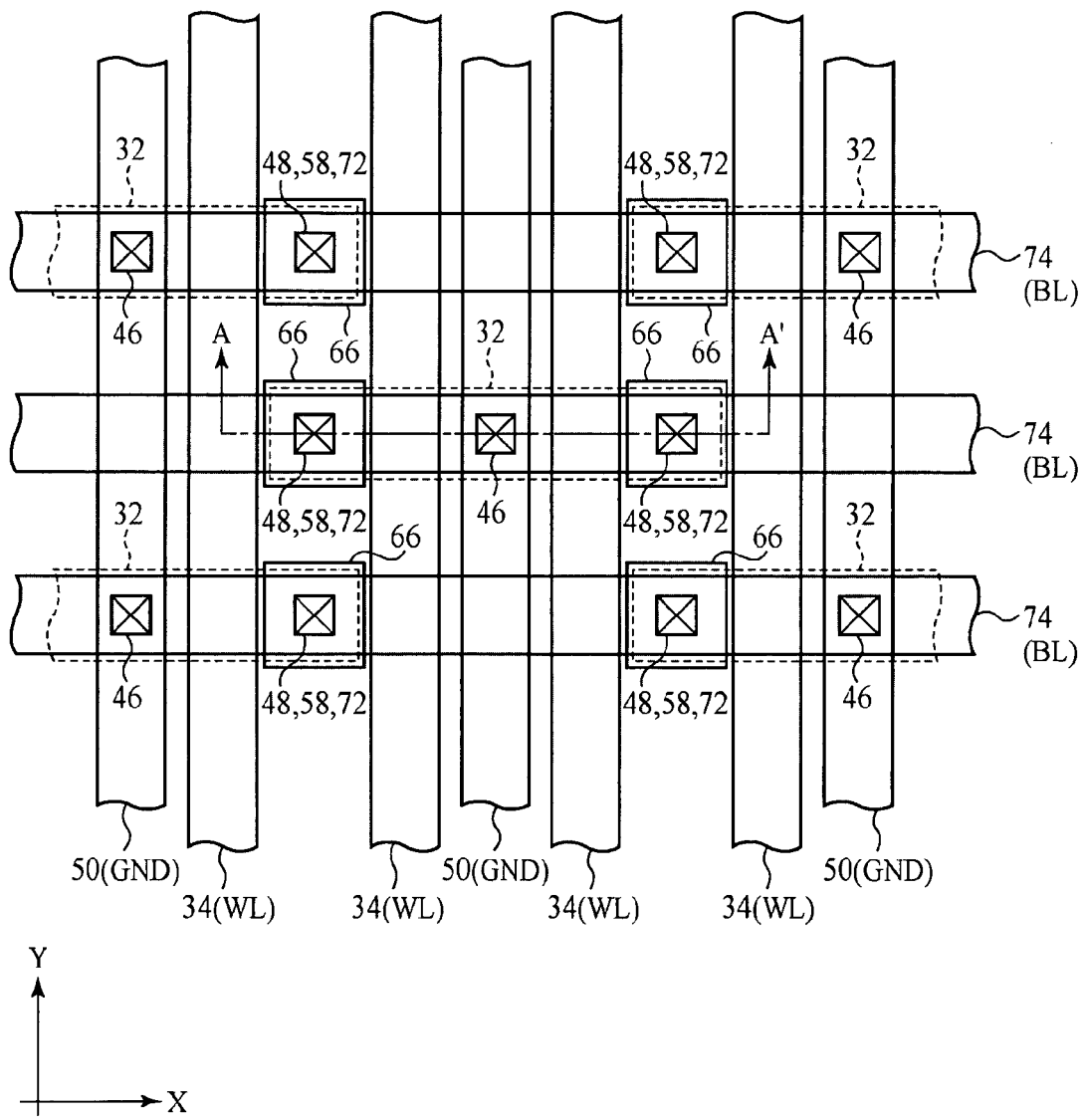
FIG. 6 is a plan view illustrating the structure of the nonvolatile semiconductor memory device according to a third embodiment of the present invention.
Figure 7:
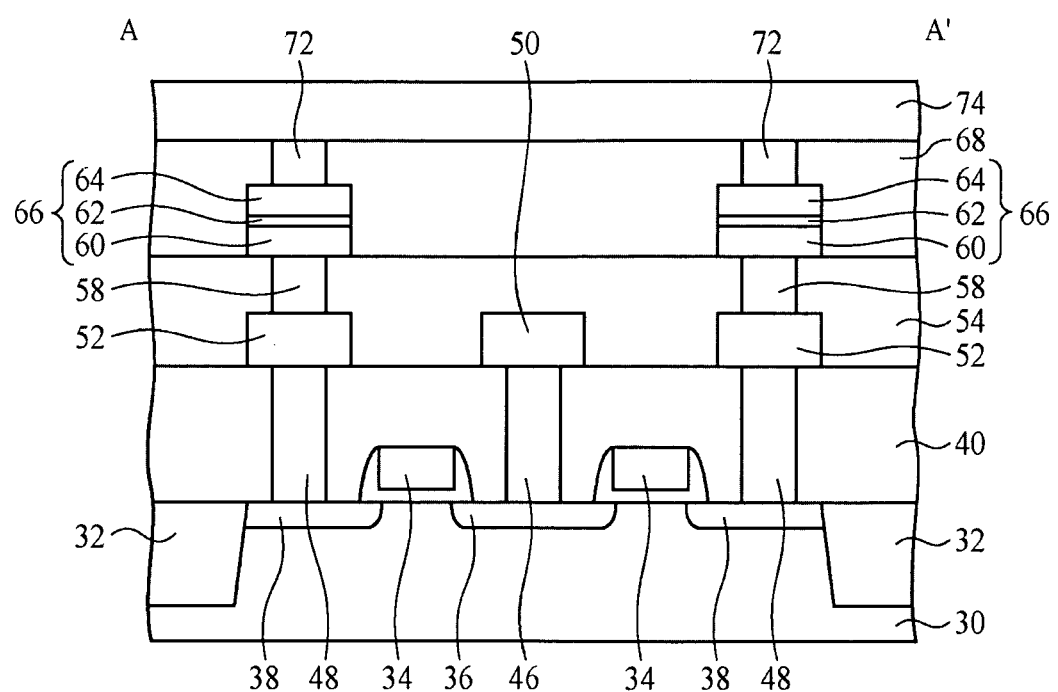
FIG. 7 is a diagrammatic sectional view illustrating the structure of the nonvolatile semiconductor memory device according to the third embodiment of the present invention.

FIG. 6 is a plan view illustrating the structure of the nonvolatile semiconductor memory device according to the present embodiment. FIG. 7 is a diagrammatic sectional view illustrating the structure of the nonvolatile semiconductor memory device according to the present embodiment. FIGS. 8A-8G are sectional views illustrating the method of manufacturing the nonvolatile semiconductor memory according to the present embodiment.

In the present embodiment, one example of the specific structure of the nonvolatile semiconductor memory device which realizes the circuit structure illustrated in FIG. 1 and the method of manufacturing the same.

First, the structure of the nonvolatile semiconductor memory device according to the present embodiment will be explained with reference to FIGS. 6 and 7. FIG. 7 is the sectional view along the A-A' line in FIG. 6.

A device isolation film 32 for defining device regions is formed in a silicon substrate 30. Each device region has a rectangular shape elongated in the X-direction. A plurality of active regions is arranged zigzag to each other.

Over the silicon substrate 30 with the device isolation film 32 formed in, a plurality of word lines WL are formed, extended in the Y-direction. The word lines WL are extended two in each device region. In the active regions on both sides of the word lines WL, source/drain regions 36, 38 are formed. Thus, in each device region, two select transistors each including the gate electrode 34 functioning also as the word line WL and the source/drain regions 36, 38 are formed. The two select transistors formed in one device region include the source/drain regions 36 in common.

Over the silicon substrate 30 with the select transistors 12 formed on, an inter-layer insulating film 40 is formed. In the inter-layer insulating film 40, a contact plugs 46 connected to the source/drain regions 36 and contact plugs 48 connected to the source/drain regions 38 are buried.

Over the inter-layer insulating film 40, ground lines 50 electrically connected to the source/drain region 36 (the source terminal) via the contact plug 46, and relay interconnections 52 electrically connected to the source/drain regions 38 (the drain terminals) via the contact plugs 48 are formed. As illustrated in FIG. 7, the ground lines 50 (GND) are extended in the Y-direction.

Over the inter-layer insulating film 40 with the ground lines 50 and the relay interconnections 52 formed on, an inter-layer insulating film 54 is formed. In the inter-layer insulating film 54, contact plugs 58 connected to the relay interconnections 52 are buried.

Over the inter-layer insulating film 54 with the contact plugs 58 buried in, the resistance memory elements 66 are formed. The resistance memory elements 66 each include a lower electrode 60 electrically connected to the source/drain region 38 via the contact plug 58, the relay interconnection 52 and the contact plug 48, a resistance memory layer 62 of a resistance memory material formed on the lower electrode 60, and an upper electrode 64 formed on the resistance memory layer 62.

Over the inter-layer insulating film 54 with the resistance memory elements 66 formed on, an inter-layer insulating film 68 is formed. In the inter-layer insulating film 68, contact plugs 72 connected to the upper electrodes 64 of the resistance memory elements 66 are buried.

Over the inter-layer insulating film 68 with the contact plugs 72 buried in, bit lines 74 electrically connected to the upper electrodes 64 of the resistance memory elements 66 via the contact plugs 72 are formed. As illustrated in FIG. 7, the bit lines (BL) 74 are extended in the X-direction.

Thus, the nonvolatile semiconductor memory device having the memory cell array illustrated in FIG. 1 is formed.

Next, the method of manufacturing the nonvolatile semiconductor memory device according to the present embodiment will be explained with reference to FIGS. 8A to 8G.

First, in the silicon substrate 30, the device isolation film 32 for defining the device regions is formed by, e.g., STI (Shallow Trench Isolation) method.

Figure 8A:
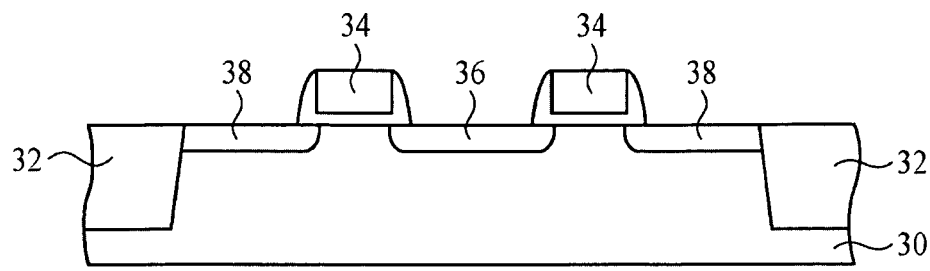
FIGS. 8A-8G are sectional views illustrating the method of manufacturing the nonvolatile semiconductor memory according to the third embodiment of the present invention.

Next, over the device regions in the silicon substrate 30, the select transistors 12 each including the gate electrode 34 and the source/drain regions 36, 38 are formed (FIG. 8A).

Next, over the silicon substrate 30 with the select transistors 12 formed on, silicon oxide film is deposited by, e.g., CVD method, and then the surface of the silicon oxide film is polished by, e.g., CMP method to form the inter-layer insulating film 40 of the silicon oxide film having the surface planarized.

Then, by photolithography and dry etching, the contact holes 42, 44 down to the source/drain regions 36, 38 are formed in the inter-layer insulating film 40.

Figure 8B:
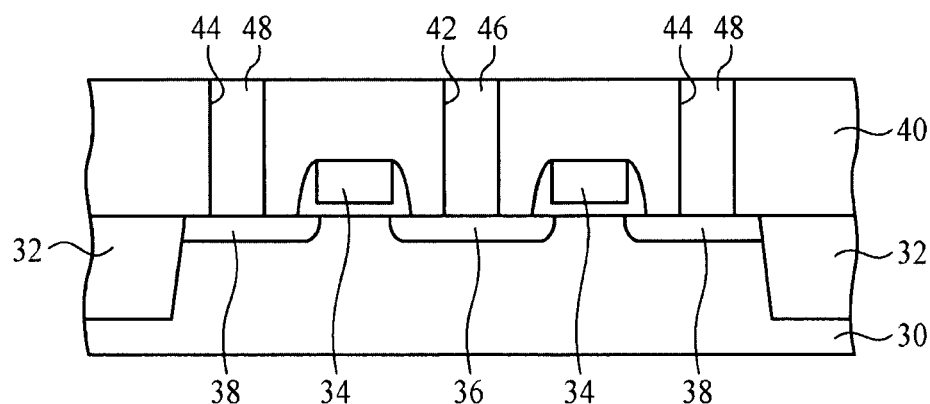

Next, barrier metal and tungsten film are deposited by, e.g., CVD method, and then these conductive films are etched back to form in the contact holes 42, 44 the contact plugs 46, 48 electrically connected to the source/drain regions 36, 38 (FIG. 8B).

Figure 8C:
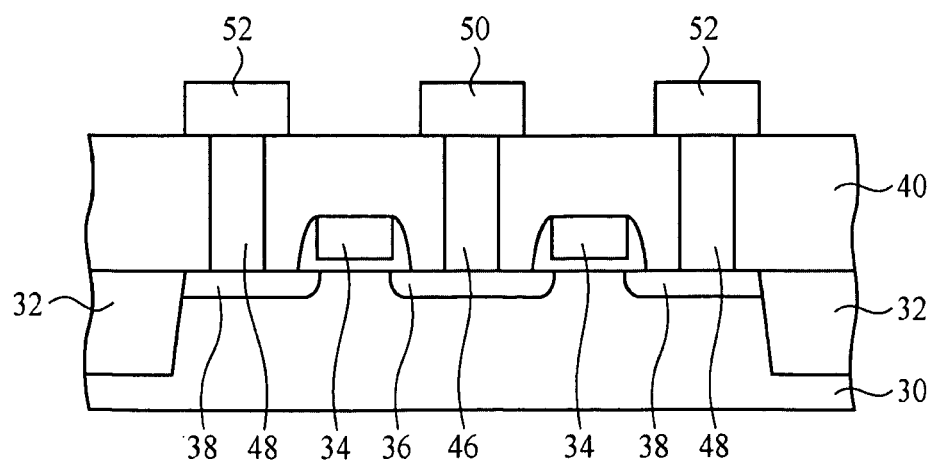

Then, over the inter-layer insulating film 40 with the contact plugs 46, 48 buried in, conductive film is deposited by, e.g., CVD method, and this conductive film is patterned by photolithography and dry etching to form the ground lines 50 electrically connected to the source/drain regions 36 via the contact plugs 46 and the relay interconnections 52 electrically connected to the source/drain regions 38 via the contact plugs 48 (FIG. 8C).

Next, over the inter-layer insulating film 40 with the ground lines 50 and the relay interconnections 52 formed on, silicon oxide film is deposited by, e.g., CVD method, and then the surface of the silicon oxide film is polished by, e.g., CMP method to form the inter-layer insulating film 54 of the silicon oxide film having the surface planarized.

Then, by photolithography and dry etching, the contact holes 56 down to the relay interconnections 52 are formed in the inter-layer insulating film 54.

Figure 8D:
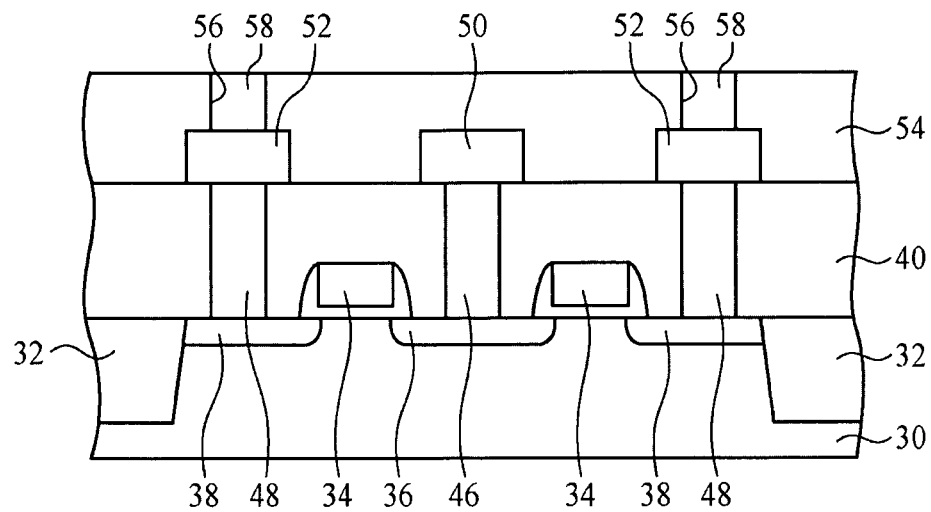

Next, barrier metal and tungsten film are deposited by, e.g., CVD method, and then these conductive films are etched back to form in the contact holes 56 the contact plugs 58 electrically connected to the source/drain regions 38 via the relay interconnections 52 and the contact plugs 48 (FIG. 8D).

Then, over the inter-layer insulating film 54 with the contact plugs 58 buried in, platinum film, for example, is deposited by, e.g., sputtering method.

Next, on the platinum film, $TiO_x$ film is deposited by, e.g., laser abrasion method, sol-gel method, sputtering method, MOCVD method or others.

Next, on the $TiO_x$ film, platinum film, for example, is deposited by, e.g., sputtering method.

Figure 8E:
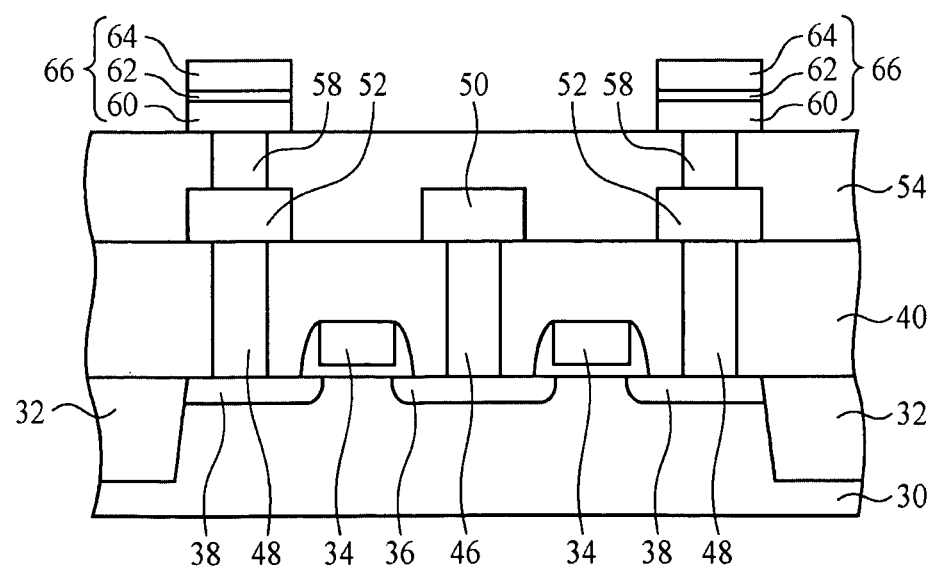

Then, by photolithography and dry etching, the layer film of the platinum film/the $TiO_x$ film/the platinum film is patterned. Thus, the resistance memory elements 66 each including the lower electrode 60 of the platinum film electrically connected to the source/drain region 38 via the contact plug 58, the relay interconnection 52 and the contact plug 48, the resistance memory layer 62 of the $TiO_x$ film formed on the lower electrode 60 and the upper electrode 64 of the platinum film formed on the resistance memory layer 62 are formed (FIG. 8E).

As the resistance memory material forming the resistance memory layer 62, $NiO_x$, $YO_x$, $CeO_x$, $MgO_x$, $ZnO_x$, $ZrO_x$, $HfO_x$, $WO_x$, $NbO_x$, $TaO_x$, $CrO_x$, $MnO_x$, $AlO_x$, $VO_x$, $SiO_x$, etc., for example, other than $TiO_x$ film can be used. Oxide materials containing a plurality of metals and semiconductor atoms, such as $Pr_{1-x}Ca_xMnO_3$, $La_{1-x}Ca_xMnO_3$, $SrTiO_3$, $YBa_2Cu_3O$, $LaNiO$ etc., can be also used. These resistance memory materials may be used singly or in layer structures.

As the electrode material forming the lower electrodes 60 and the upper electrodes 64, Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, NiSi, $MoSi_2$, $TiSi_2$, Al—Si, Al—Cu, Al—Si—Cu, etc., for example, other than platinum can be used. The electrode material forming the lower electrodes 60 and the electrode material forming the lower electrodes materials 64 may be the same or different from each other.

Next, over the inter-layer insulating film 54 with the resistance memory elements 66 formed on, silicon oxide film is deposited by, e.g., CVD method, and then the surface of the silicon oxide film is polished by, e.g., CMP method to form the inter-layer insulating film 68 of the silicon oxide film having the surface planarized.

Then, by photolithography and dry etching, the contact holes 70 down to the upper electrodes 64 of the resistance memory elements 66 are formed.

Figure 8F:
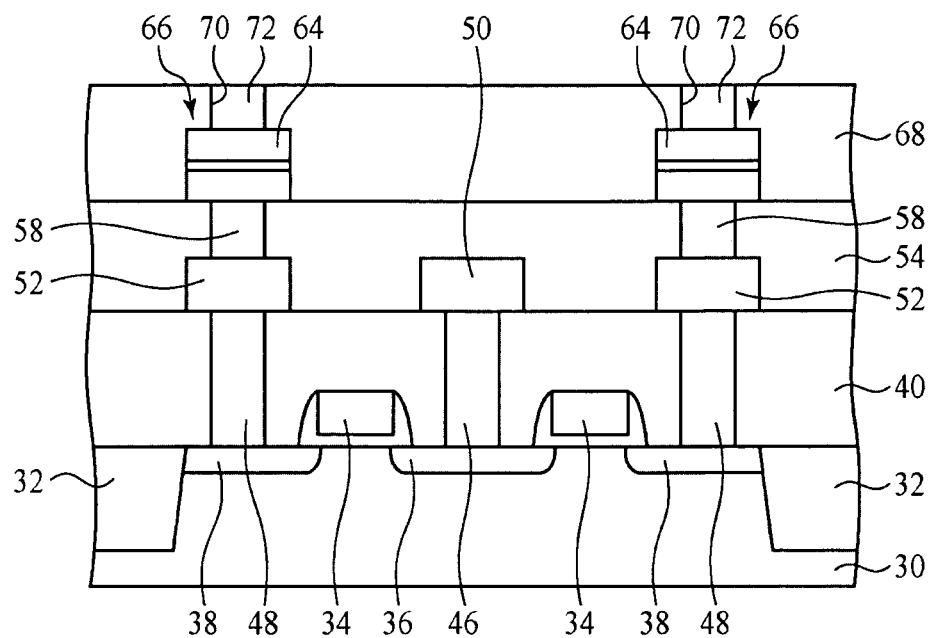

Then, barrier metal and tungsten film are deposited by, e.g., CVD method, and then these conductive films are etched back to form in the contact holes 70 the contact plugs 72 connected to the upper electrodes 64 of the resistance memory elements 66 (FIG. 8F).

Figure 8G:
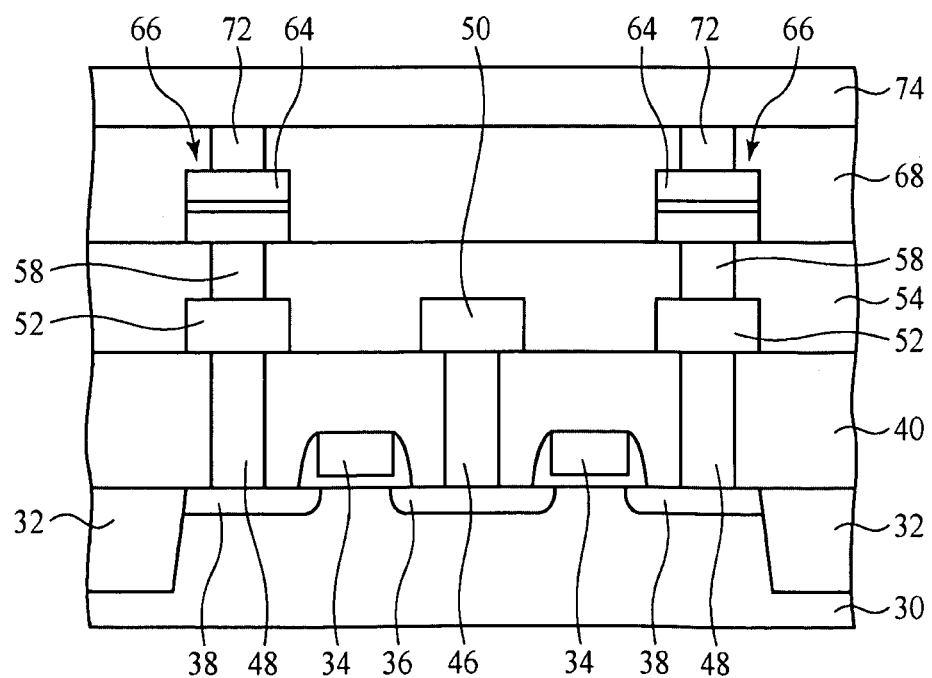
Figure 9:
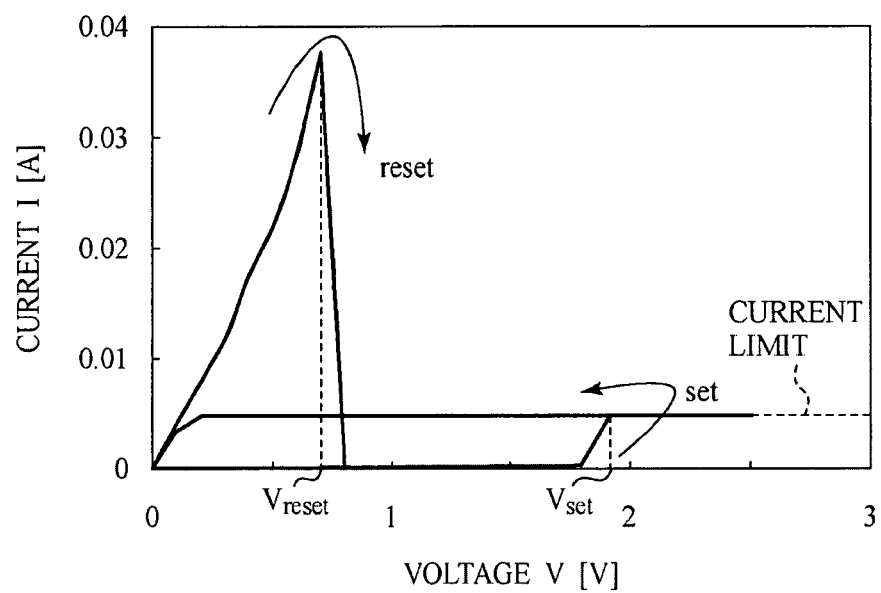
FIG. 9 is a graph of the electric characteristics of the resistance memory element.

Then, a conductive film is deposited over the inter-layer insulating film 68 with the contact plugs 72 buried in, and then the conductive film is patterned by photolithography and dry etching to form the bit lines 74 electrically connected to the upper electrodes 64 of the resistance memory elements 66 via the contact plugs 72 (FIG. 8G).

Then, upper-level interconnection layers, etc. as required are formed, and the nonvolatile semiconductor memory device is completed.

The present invention is not limited to the above-described embodiments and can cover other various modifications.

For example, in the above-described embodiments, as the transistor for clamping the voltage of the bit line, the column selector for selecting the bit line is used, but the transistor for clamping the voltage of the bit line is not limited to the column selector. As the transistor for clamping the voltage of the bit line, other transistors disposed between the write circuit and the bit line may be used, or new transistor may be provided between the write circuit and the bit line.

In the above-described embodiments, the resistance memory elements 66 include the resistance memory layer 62 of $TiO_x$, but the resistance memory layer 62 of the resistance memory elements 66 is not limited to this. As the resistance memory materials usable in the present invention are a plurality of metals, such as $TiO_x$, $NiO_x$, $YO_x$, $CeO_x$, $MgO_x$, $ZnO_x$, $ZrO_x$, $HfO_x$, $WO_x$, $NbO_x$, $TaO_x$, $CrO_x$, $MnO_x$, $AlO_x$, $VO_x$, $SiO_x$, etc. Otherwise, oxide materials containing a plurality of metals or semiconductor atoms, such as $Pr_{1-x}C_xMnO_3$, $La_{1-x}Ca_xMnO_3$, $SrTiO_3$, $YBa_2Cu_3O_y$, $LaNiO$, etc., may be used. These resistance memory materials may be used singly or in a layer structure.

In the above-described embodiments, the upper electrodes 60 and the lower electrodes 64 are formed of platinum, but the constituent material of the electrodes is not limited to this. The electrode materials applicable to the present invention are, e.g., Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, NiSi, $MoSi_2$, $TiSi_2$, Al—Si, Al—Cu, Al—Si—Cu, etc.

The structure of the nonvolatile semiconductor memory device according to the third embodiment is one example which realizes the circuit structure illustrated in FIG. 1, and the structure of the nonvolatile semiconductor memory device is not limited to this.

All examples and conditional language recited herein are intended for pedagogical purpose to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alternations could be made hereto without departing from the spirit and scope of the invention.

What is claimed is:

1. A method of writing into a semiconductor memory device comprising a resistance memory element which memorizes a high resistance state and a low resistance state and switches between the high resistance state and the low resistance state by an application of a voltage; a first transistor comprising a drain terminal connected to one terminal of the resistance memory element and a source terminal connected to a reference voltage; and a second transistor comprising a source terminal connected to the other terminal of the resistance memory element, comprising:

clamping a voltage to be applied to said other terminal of the resistance memory element at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when a write voltage is applied to the resistance memory element via the second transistor to switch the resistance memory element from the low resistance state to the high resistance state.

2. The method of writing into a semiconductor memory device according to claim 1, wherein
the write voltage to be applied to a drain terminal of the second transistor is set at a value which is not less than a total of the reset voltage and the threshold voltage of the second transistor.

3. The method of writing into a semiconductor memory device according to claim 1, wherein
the write voltage, the second drive voltage to be applied to the gate terminal of the second transistor and a first drive voltage to be applied to a gate terminal of the first transistor are set at a power supply voltage.

4. The method of writing into a semiconductor memory device according to claim 1, wherein
a first drive voltage to be applied to a gate terminal of the first transistor is so set that a channel resistance of the first transistor is sufficiently smaller than a resistance value of the resistance memory element in the low resistance state.

5. The method of writing into a semiconductor memory device according to claim 1, wherein
a constant voltage is applied to a gate terminal of the first transistor, and
the write voltage which is a pulse voltage is applied to a drain terminal of the second transistor.

6. The method of writing into a semiconductor memory device according to claim 1, wherein
the write voltage which is a constant voltage is applied to a drain terminal of the second transistor.

7. A semiconductor memory device comprising:
a resistance memory element which memorizes a high resistance state and a low resistance state and switches between the high resistance state and the low resistance state by an application of a voltage;
a first transistor comprising a drain terminal connected to one terminal of the resistance memory element and a source terminal connected to a reference voltage;
a second transistor comprising a source terminal connected to the other terminal of the resistance memory element; and
a control circuit which controls a channel resistance of the first transistor at a value which is sufficiently smaller than a resistance value of the resistance memory element in the high resistance state and is sufficiently larger than a resistance value of the resistance memory element in the low resistance state by controlling a first drive voltage to be applied to a gate terminal of the first transistor, when a write voltage is applied to the resistance memory element via the second transistor to switch the resistance memory element from the high resistance state to the low resistance state, and which clamps a voltage to be applied to said other terminal of the resistance memory element at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when a write voltage is applied to the resistance memory element via the second transistor to switch the resistance memory element from the low resistance state to the high resistance state.

8. The semiconductor memory device according to claim 7, wherein
a bit line is disposed between the resistance memory element and the second transistor, and
the second transistor is a column selector which selects the bit line.

9. A semiconductor memory device comprising:
a resistance memory element which memorizes a high resistance state and a low resistance state and switches between the high resistance state and the low resistance state by an application of a voltage;
a first transistor comprising a drain terminal connected to one terminal of the resistance memory element and a source terminal connected to a reference voltage;

a second transistor comprising a source terminal connected to the other terminal of the resistance memory element; and a control circuit which clamps a voltage to be applied to said other terminal of the resistance memory element at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when a write voltage is applied to the resistance memory element via the second transistor to switch the resistance memory element from the low resistance state to the high resistance state.

10. A semiconductor memory device comprising:

a plurality of memory cells arranged in a matrix and each of which comprises a resistance memory element which memorizes a high resistance state and a low resistance state and switches between the high resistance state and the low resistance state by an application of a voltage;

a plurality of bit lines extended in a first direction and arranged in parallel with each other, each of the bit lines being connected to the other terminals of the resistance memory elements of the memory cells arranged in the first direction;

a plurality of word lines extended in a second direction crossing the first direction and arranged in parallel with each other, each of the word line being connected to gate terminals of the first transistors of the memory cells arranged in the second direction;

a plurality of second transistors, each of the second transistors being connected to each of the plurality of bit lines, each of the second transistors comprising a source terminal connected via the bit line to the other terminals of the resistance memory elements of the memory cells arranged in the first direction; and a control circuit which controls a channel resistance of the first transistor of an arbitrary one of the plurality of memory cells at a value which is sufficiently smaller than a resistance value of the resistance memory element in the high resistance state and is sufficiently larger than a resistance value of the resistance memory element in the low resistance state by controlling a first drive voltage to be applied to the word line associated with the arbitrary memory cell, when the resistance memory element of the arbitrary memory cell is switched from the high resistance state to the low resistance state, and which clamps a voltage to be applied to said other terminal of the resistance memory element of an arbitrary one of the plurality of memory cells at a value which is not less than a reset voltage of the resistance memory element and less than a set voltage of the resistance memory element by controlling a second drive voltage to be applied to a gate terminal of the second transistor so as to be set at a value which is not less than a total of the reset voltage and a threshold voltage of the second transistor and is less than a total of the set voltage and the threshold voltage of the second transistor, when the resistance memory element of the arbitrary memory cell is switched from the low resistance state to the high resistance state.

* * * * *